United States Patent

Nagai et al.

(10) Patent No.: US 6,821,705 B2
(45) Date of Patent: Nov. 23, 2004

(54) RADIATION-SENSITIVE RESIN COMPOSITION

(75) Inventors: Tomoki Nagai, Mie (JP); Jun Numata, Mie (JP); Eiichi Kobayashi, Mie (JP); Tsutomu Shimokawa, Mie (JP)

(73) Assignee: JSR Corporation, Tokyo (JP)

( * ) Notice: Subject to any disclaimer, the term of this patent is extended or adjusted under 35 U.S.C. 154(b) by 132 days.

(21) Appl. No.: 10/132,249

(22) Filed: Apr. 26, 2002

(65) Prior Publication Data

US 2002/0192593 A1 Dec. 19, 2002

(30) Foreign Application Priority Data

Apr. 27, 2001 (JP) ........................................ 133702-2001

(51) Int. Cl.[7] .............................................. G03F 7/039
(52) U.S. Cl. .................................. 430/270.1; 430/920
(58) Field of Search .............................. 430/270.1, 920

(56) References Cited

U.S. PATENT DOCUMENTS

| | | | | |
|---|---|---|---|---|
| 5,310,619 A | * | 5/1994 | Crivello et al. | 430/270.1 |
| 5,556,734 A | * | 9/1996 | Yamachika et al. | 430/270.1 |
| 5,679,495 A | * | 10/1997 | Yamachika et al. | 430/191 |
| 5,962,180 A | * | 10/1999 | Iwanaga et al. | 430/170 |
| 6,120,972 A | * | 9/2000 | Iwanaga et al. | 430/270.1 |
| 6,143,472 A | * | 11/2000 | Sumino et al. | 430/283.1 |
| 6,365,321 B1 | * | 4/2002 | Chen et al. | 430/270.1 |
| 6,503,686 B1 | * | 1/2003 | Fryd et al. | 430/270.1 |

FOREIGN PATENT DOCUMENTS

| | | | |
|---|---|---|---|
| EP | 102 450 A2 | 3/1984 | |
| EP | 1 067 112 A2 | 1/2001 | |
| JP | 3-231592 | 10/1991 | |
| JP | 4-53785 | 2/1992 | |
| JP | 06123970 A | * 5/1994 | G03F/7/039 |
| JP | 7-84180 | 3/1995 | |
| JP | 8-332686 | 12/1996 | |
| JP | 2000-357228 | 12/2000 | |

OTHER PUBLICATIONS

English language machine translation of JP 06–123970.*
Patent Abstracts of Japan, vol. 018, No. 412 (P–1780), Aug. 2, 1994 and JP 06 123970 A (Shin Etsu Chem Co. Ltd; Others: 01), May 6, 1994, Abstract.

Crivello, et al., "Deep–UV Chemically Amplified Dissolution–Inhibited Photoresists", Chem. Mater., 6, 11, 2167–2171 (1994).

* cited by examiner

*Primary Examiner*—Amanda Walke
(74) *Attorney, Agent, or Firm*—Piper Rudnick LLP; Steven B. Kelber

(57) ABSTRACT

A radiation-sensitive resin composition comprising (A) a compound of the following formula (1),

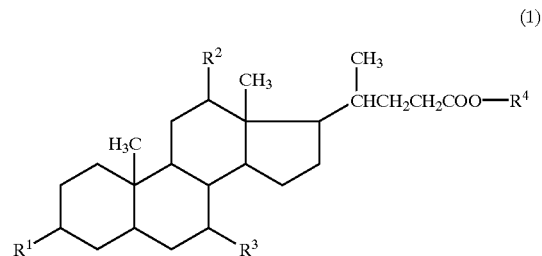

($R^1$, $R^2$, and $R^3$ is hydrogen, hydroxyl group, or monovalent organic group and $R^4$ is monovalent acid-dissociable group), (B) an alkali insoluble or scarcely soluble resin comprising a recurring unit of the following formula (2),

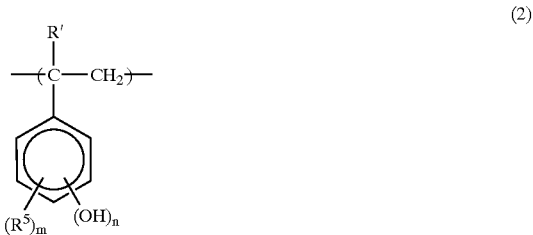

($R^5$ is hydrogen or monovalent organic group, R' hydrogen or methyl, n 1–3, m 0–3) and a recurring unit containing acid-dissociable group, and (C) a photoacid generator. The resin composition is useful as a chemically amplified resist, exhibits high sensitivity, resolution, radiation transmittance, and surface smoothness, and is free from the problem of partial insolublization during overexposure.

13 Claims, No Drawings

RADIATION-SENSITIVE RESIN COMPOSITION

BACKGROUND OF THE INVENTION

1. Field of the Invention

The present invention relates to a radiation-sensitive resin composition and, more particularly, to a radiation-sensitive resin composition suitable as a chemically-amplified resist useful for microfabrication utilizing various types of radiation, for example, deep ultraviolet rays such as a KrF excimer laser, ArF excimer laser, or F2 excimer laser, EUV, X-rays such as synchrotron radiation, or charged particle rays such as electron beams.

2. Description of the Background Art

In the field of microfabrication represented by fabrication of integrated circuit devices, photolithographic technology enabling microfabrication with a line width of 0.20 μm or less has been demanded in recent years in order to achieve a higher degree of integration.

A conventional photolithographic process utilizes near ultraviolet rays such as i-line radiation. It is known in the art that microfabrication with a line width of a sub-quarter micron order using near ultraviolet rays is very difficult.

Therefore, use of radiation with a shorter wavelength has been studied for enabling microfabrication with a line width of 0.20 μm or less. As radiation with a shorter wavelength, deep ultraviolet rays represented by a line spectrum of a mercury lamp and an excimer laser, X-rays, electron beams, and the like can be given. Of these, a KrF excimer laser (wavelength: 248 nm), an ArF excimer laser (wavelength: 193 nm), and an F2 excimer laser (wavelength: 157 nm) have attracted attention.

As a radiation-sensitive resin composition applicable to shorter wavelength radiation, a number of compositions utilizing a chemical amplification effect between a component having an acid-dissociable functional group and a photoacid generator which generates an acid upon irradiation (hereinafter called "exposure") has been proposed. Such a composition is hereinafter called a chemically-amplified radiation-sensitive composition.

As the chemically-amplified radiation-sensitive composition, Japanese Patent Publication No. 27660/1990 discloses a composition comprising a resin containing a t-butyl ester group of carboxylic acid or a t-butylcarbonate group of phenol and a photoacid generator. This composition utilizes the effect of the resin to release a t-butyl ester group or t-butyl carbonate group by the action of an acid generated upon exposure to form an acidic group such as a carboxylic group or a phenolic hydroxyl group, which renders an exposed area on a resist film readily soluble in an alkaline developer.

Micronization of photolithography processes in recent years has been remarkable. In particular, in the KrF photolithography processes the limit resolution has been decreasing close to one half of the light source wavelength or less. For this reason, characteristics required for photo resists have become increasingly stringent. In particular, improvement in the resolution performance, radiation transmittance, and surface smoothness of minute patterns, as well as a solution to the problem of partial insolublization during overexposure are desired.

For the improvement of resolution performance among these requirements, a method of increasing the amount of a photoacid generator which generates a super-strong acid upon exposure, a method of reducing the desorption energy of acid-dissociating functional groups in the resin, and the like has been proposed. The former method worsens the problem of partial insolublization during overexposure, whereas the latter cannot readily be put into practice due to difficulty in manufacturing the resin.

As a method for improving radiation transmittance, a method of increasing the content of (meth) acrylic-type recurring units in the resin and a method of decreasing the amount of photoacid generators are conceivable. However, the former method involves a problem of impairing heat resistance which results in lowered dry etching resistance, whereas the latter method has a problem of decreasing resolution performance.

A method of increasing the amount of photoacid generator and a method of decreasing the glass transition temperature of the resin are thought to be possible solutions to the improvement of surface smoothness of minute patterns. However, increasing the amount of photoacid generator results in a decrease in the radiation transmittance, which gives rise to trapezoid pattern configuration and difficult line width control during dry etching. Decreasing the glass transition temperature of the resin, on the other hand, impairs heat resistance. In view of this situation, development of a resist material or resist composition which can improve the resolution performance, radiation transmittance, and surface smoothness of minute patterns, and overcome the problem of partial insolublization during overexposure without adversely affecting basic characteristics of photoresists are strongly desired.

An object of the present invention is to provide a radiation-sensitive resin composition that responds to active radiation, for example ultraviolet rays such as a KrF excimer laser, ArF excimer laser, or F2 excimer laser, which when used as a chemically amplified resist can improve resolution performance, radiation transmittance, and surface smoothness of minute patterns, and overcome the problem of partial insolublization during overexposure without adversely affecting basic characteristics of a resist such as pattern form, dry etching resistance, and the like.

SUMMARY OF THE INVENTION

The present invention provides a radiation-sensitive resin composition comprising:

(A) a compound of the following formula (1),

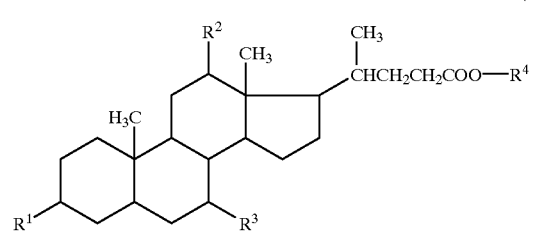

wherein $R^1$, $R^2$ and $R^3$ individually represent a hydrogen atom, a hydroxyl group, or a monovalent organic group, provided that at least one of the groups $R^1$, $R^2$, and $R^3$ is a hydroxyl group, and $R^4$ represents a monovalent acid-dissociable group or a monovalent organic group containing an acid-dissociable moiety in the structure, (B) a resin comprising a recurring unit of the following formula (2),

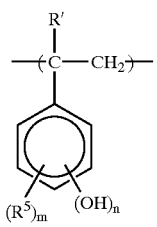

(2)

wherein $R^5$ represents a hydrogen atom or a monovalent organic group, R' represents a hydrogen atom or methyl group, n is an integer of 1–3, and m is an integer of 0–3, and a recurring unit containing acid-dissociable group, the resin being insoluble or scarcely soluble in alkali, and (C) a photoacid generator.

In a preferred embodiment of the above radiation-sensitive resin composition, $R^1$, $R^2$, and $R^3$ in the formula (1) are individually a hydrogen atom, hydroxyl group, methyl group, ethyl group, methoxy group, or t-butoxy group.

In another preferred embodiment, $R^1$, $R^2$, and $R^3$ in the formula (1) are individually a hydrogen atom or hydroxyl group.

In the above radiation-sensitive resin composition, $R^4$ in the formula (1) is preferably a group of the following formula (3),

(3)

wherein $R^6$ represents a monovalent acid-dissociable group.

In the above radiation-sensitive resin composition, the recurring unit containing an acid-dissociable group in the resin (B) is preferably a unit obtainable by cleavage of a polymerizable unsaturated bond in a compound, which is obtainable by replacing the hydrogen atom in the phenolic hydroxyl group or carboxyl group in a compound selected from the group consisting of o-hydroxystyrene, m-hydroxystyrene, p-hydroxystyrene, p-hydroxy-α-methylstyrene, and (meth)acrylic acid, with a monovalent acid-dissociable group.

In the above radiation-sensitive resin composition the introduction ratio of the acid-dissociable groups to the resin (B), which is the ratio of the number of the acid-dissociable groups to the total number of the unprotected acidic functional groups and the acid-dissoclable groups in the resin, is preferably 10–50%.

In the above radiation-sensitive resin composition the photoacid generator (C) preferably comprises a compound of the following formula (4),

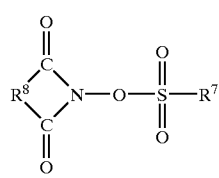

(4)

wherein $R^7$ is a monovalent organic group and $R^8$ is a divalent organic group.

Other objects, features and advantages of the invention will hereinafter become more readily apparent from the following description.

DETAILED DESCRIPTION OF THE INVENTION AND PREFERRED EMBODIMENTS

The present invention will be described in detail below.

Component (A)

The component (A) of the present invention is a compound represented by the above formula (1) (hereinafter referred to as "compound (1)").

The compound (1) exhibits excellent mutual solubility with other components used in radiation-sensitive resin compositions due to possession of a hydrophobic steroid skeleton and moderate polar groups such as an alcoholic hydroxyl group and ester group. In addition, the compound exhibits a large dissolution contrast and can suppress partial insolublization during overexposure due to a large polarity change before and after dissociation of the acid-dissociable group. Furthermore, because the compound possesses a large alicyclic structure, resist coatings obtained from the resin not only exhibit high transmittance to short wave radiations, particularly to a KrF excimer laser, ArF excimer laser, and F2 excimer laser, but also exhibit improved dry etching resistance.

The following groups are given as examples of the monovalent organic group represented by $R^1$, $R^2$, or $R^3$ in the formula (1): linear or branched alkyl groups having 1–12 carbon atoms such as a methyl group, ethyl group, n-propyl group, i-propyl group, n-butyl group, 2-methylpropyl group, 1-methylpropyl group, and t-butyl group; linear or branched alkoxyl groups having 1–12 carbon atoms such as a methoxy group, ethoxy group, n-propoxy group, i-propoxy group, n-butoxy group, 2-methylpropoxy group, 1-methylpropoxy group, and t-butoxygroup; alkoxycoarbonyl groups such as a t-butoxy carbonyl group; and alkoxyalkoxy groups such as a ethoxyethoxy group.

Preferable groups for $R^1$, $R^2$, and $R^3$ in the formula (1) are a hydrogen atom, hydroxyl group, methyl group, ethyl group, methoxy group, and t-butoxy group, and the like.

As examples of the monovalent acid-dissociable organic groups represented by $R^4$, a substituted methyl group, 1-substituted ethyl group, 1-branched alkyl group, tricarbylsilyl group, tricarbylgermyl group, alkoxycarbonyl group, acyl group, and cyclic acid-dissociable group can be given.

As examples of the substituted methyl group, a methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and adamantylmethyl group can be given.

As examples of the 1-substituted ethyl group, a 1-methoxyethyl group, 1-methylthioethyl group, 1,1-dimethoxyethyl group, 1-ethoxyethyl group, 1-ethylthioethyl group, 1,1-diethoxyethyl group, 1-ethoxypropyl group, 1-propoxyethyl group, 1-cyclohexyloxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-i-propoxycarbonylethyl group, 1-n-butoxycarbonylethyl group, and 1-t-butoxycarbonylethyl group can be given.

As examples of 1-branched alkyl group, an i-propyl group, sec-butyl group, t-butyl group, 1,1-dimethylpropyl group, 1-methylbutyl group, 1,1-dimethylbutyl group, and the like can be given.

As examples of the tricarbylsilyl groups, a trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, and triphenylsilyl group can be given.

As examples of the tricarbylgermyl groups, a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, and triphenylgermyl group can be given.

As examples of the alkoxycarbonyl groups, a methoxycarbonyl group, ethoxycarbonyl group, i-propoxycarbonyl group, t-butoxycarbonyl group, and the like can be given.

As examples of the acyl groups, an acetyl group, propionyl group, butyryl group, heptanoyl group, hexanoyl group, valeryl group, pivaloyl group, isovaleryl group, lauloyl group, myristoyl group, palmitoyl group, stearoyl group, oxalyl group, malonyl group, scucinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of the above cyclic acid-dissociable groups, a cyclopropyl group, cyclopentyl group, 1-methylcyclopentyl group, 1-ethylcyclopentyl group, cyclohexyl group, 1-methylcyclohexyl group, 1-ethylcyclohexyl group, 4-methoxycyclohexyl group, cyclohexenyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide group, norbornyl group, methylnorbornyl group, ethylnorbornyl group, isobornyl group, tricyclodecanyl group, dicyclopentenyl group, adamantyl group, 2-methyl-2-adamantyl group, and 2-ethyl-2-adamantyl group can be given.

Of these monovalent acid-dissociable groups, a t-butyl group, benzyl group, 1-methoxyethyl group, 1-ethoxyethyl group, trimethylsilyl group, t-butoxycarbonyl group, t-butoxycarbonylmethyl group, 1-methylcyclopentyl group, 1-ethylcyclopentyl group, 1-methylcyclohexyl group, 1-ethylcyclohexyl group, tetrahydropyranyl group, tetrahydrofuranyl group, tetrahydrothiopyranyl group, tetrahydrothiofuranyl group, 2-methyl-2-adamantyl group, and the like are preferable.

As the monovalent organic group having an acid-dissociable moiety in the structure represented by $R^4$, organic groups of the following formula (3) are preferable, $$—CH_2COO—R^6 \qquad (3)$$

wherein $R^6$ represents a monovalent acid-dissociable group.

As examples of the monovalent acid-dissociable groups represented by $R^6$, the same groups as mentioned above for the monovalent acid-dissociable groups, such as a substituted methyl group, 1-substituted ethyl group, 1-branched alkyl group, silyl group, germyl group, alkoxycarbonyl group, acyl group, and cyclic acid-dissociable group can be given.

Of these monovalent acid-dissociable groups, a t-butyl group, benzyl group, 1-methoxyethyl group, 1-ethoxyethyl group, trimethylsilyl group, t-butoxycarbonyl group, t-butoxycarbonylmethyl group, 1-methylcyclopentyl group, 1-ethylcyclopentyl group, 1-methylcyclohexyl group, 1-ethylcyclohexyl group, tetrahydropyranyl group, tetrahydrofuranyl group, tetrahydrothiopyranyl group, tetrahydrothiofuranyl group, 2-methyl-2-adamantyl group, and the like are preferable.

The compound (1) is synthesized by esterification of a corresponding steroid-type carboxylic acid such as a cholic acid, deoxycholic acid, or lithocholic acid in the presence of a catalyst. The following esterification reactions can be applied.

(1) Esterification with an Acid Catalyst

The compound (1) is synthesized by dissolving a steroid-type carboxylic acid and an acid catalyst in a solvent, adding a corresponding olefin such as an isobutene, and reacting the mixture.

As the acid catalyst, p-toluenesulfonic acid, methanesulfonic acid, concentrated sulfuric acid, phosphoric acid, and the like can be given. These acid catalysts may be used either individually or in combination of two or more.

(2) Esterification with a Basic Catalyst

The compound (1) is synthesized by dissolving a steroid-type carboxylic acid and a basic catalyst in a solvent, adding a bromoacetic acid ester such as a t-butyl bromoacetate, and reacting the mixture.

As the basic catalyst, a super-strong basic catalyst such as sodium amide, sodium hydride, n-butyl lithium, and 1,8-diazabicyclo[5.4.0]undec-7-ene; a strong basic catalyst such as methoxy potassium, ethoxy potassium, and t-butoxy potassium; a weak basic catalyst such as triethylamine tri-n-butyl amine, and potassium carbonate; and the like can be given. These basic catalysts may be used either individually or in combination of two or more.

The reactions (1) and (2) are carried out at a temperature of usually −20° C. to 150° C., and preferably 0 to 70° C., for usually 1 minute to 96 hours, and preferably 30 minutes to 48 hours.

As the solvents used in the above esterification reactions (1) and (2), dimethylformamide, dimethylacetamide, dimethylsulfoxide, t-butanol, acetone, acetonitrile, tetrahydrofuran, chloroform, methylene chloride, and the like can be given. These solvents may be used either individually or in combinations of two or more.

In the present invention, the compounds (1) may be used either individually or in combination of two or more.

Component (B)

The component (B) of the present invention is a resin comprising a recurring unit of the above formula (2) (hereinafter referred to as "recurring unit (2)") and a recurring unit containing an acid-dissociable group. The resin is insoluble or scarcely soluble in alkali (this resin is hereinafter referred to as "resin (B)").

The following groups are given as examples of the monovalent organic group represented by $R^5$ in the resin (B): linear or branched alkyl groups having 1–12 carbon atoms such as a methyl group, ethyl group, n-propyl group, i-propyl group, n-butyl group, 2-methylpropyl group, 1-methylpropyl group, and t-butyl group; linear or branched alkoxyl groups having 1–12 carbon atoms such as a methoxy group, ethoxy group, n-propoxy group, i-propoxy group, n-butoxy group, 2-methylpropoxy group, 1-methylpropoxy group, and t-butoxygroup.

Particularly preferable groups for $R^5$ in the formula (2) of resin (B) are a hydrogen atom, methyl group, ethyl group, methoxy group, and the like.

In the formula (2), n is preferably 1 or 2, and m is preferably 0 or 1.

As examples of preferable recurring units (2) in the resin (B), units obtainable by cleavage of a polymerizable unsaturated bond such as o-hydroxystyrene, m-hydroxystyrene, p-hydroxystyrene, p-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, and 2,4,6-trihydroxystyrene can be given.

Of these monomers, units obtainable by cleavage of a polymerizable unsaturated bond such as o-hydroxystyrene, m-hydroxystyrene, p-hydroxystyrene, and p-hydroxy-α-methylstyrene are preferable.

The recurring units (2) may be used in the resin (B) either individually or in combination of two or more.

As recurring units containing an acid-dissociable group, units obtainable by cleavage of a polymerizable unsaturated bond in a compound, which is obtainable by replacing the hydrogen atom in the phenolic hydroxyl group or carboxyl group in a compound, such as o-hydroxystyrene, m-hydroxystyrene, p-hydroxystyrene, p-hydroxy-α-methylstyrene, or (meth) acrylic acid, with a monovalent acid-dissociable group can be given.

As the acid-dissociable groups in the recurring unit containing an acid-dissociable group, the same groups as mentioned above for the monovalent acid-dissociable groups represented by $R^4$, such as a substituted methyl group, 1-substituted ethyl group, 1-branched alkyl group, tricarbylsilyl group, tricarbylgermyl group, alkoxycarbonyl group, acyl group, and cyclic acid-dissociable group can be given.

Of these acid-decomposable groups, a t-butyl group, benzyl group, 1-methoxyethyl group, 1-ethoxyethyl group, trimethylsilyl group, t-butoxycarbonyl group, t-butoxycarbonylmethyl group, tetrahydropyranyl group, tetrahydrofuranyl group, tetrahydrothiopyranyl group, tetrahydrothiofuranyl group, 2-methyl-2-adamantyl group, and the like are preferable.

As the recurring units containing an acid-dissociable group, 4-t-butoxystyrene, 1-ethoxyethoxystyrene, 4-t-butoxycarbonyloxystyrene, 4-t-butoxycarbonylmethyloxystyrene, 4-tetrahydropyranyloxystyrene, 4-tetrahydrofuranyloxystyrene, t-butyl (meth)acrylate, 1-methylcyclopentyl (meth) acrylate, isobornyl (meth) acrylate, tricyclodecanyl (meth)acrylate, 2-methyl-2-adamantyl (meth)acrylate, and the like are preferable.

The recurring units containing an acid-dissociable group maybe used in the resin (B) either individuallyor in combination of two or more.

The resin (B) may contain one or more recurring units other than the recurring unit (2) or the recurring units containing an acid-dissociable group (hereinafter referred to as "other recurring units").

The other recurring units include units obtainable by cleavage of a polymerizable unsaturated bond of monomers such as, for example, vinyl aromatic compounds such as styrenes such as styrene, α-methylstyrene, 2-methylstyrene, 3-methylstyrene, 4-methylstyrene, 2-methoxystyrene, 3-methoxystyrene, 4-methoxystyrene, and 4-(2-t-butoxycarbonylethyloxy) styrene; (meth)acrylates such as methyl (meth)acrylate, ethyl (meth)acrylate, n-propyl (meth)acrylate, n-butyl (meth)acrylate, i-butyl (meth) acrylate, n-pentyl (meth)acrylate, neopentyl (meth)acrylate, n-hexyl (meth)acrylate, 2-ethylhexyl (meth)acrylate, 2-hydroxyethyl (meth)acrylate, 2-hydroxypropyl (meth) acrylate, 3-hydroxypropyl (meth)acrylate, phenyl (meth) acrylate, and phenethyl (meth)acrylate; monomers of the following formula (5),

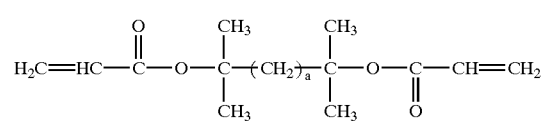

(5)

wherein a is an integer of 1–6; monomers of the following formula (6),

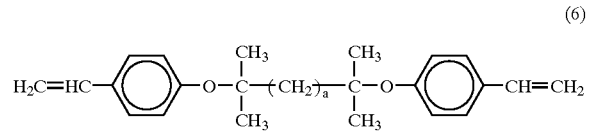

(6)

wherein a is an integer of 1–6; monomers of the following formula (7),

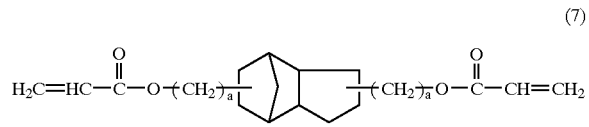

(7)

wherein a is an integer of 1–6; unsaturated carboxylic acids such as (meth)acrylic acid, crotonic acid, maleic acid, fumaric acid, and cinnamic acid; carboxylalkyl esters of unsaturated carboxylic acids such as 2-carboxyethyl (meth) acrylate, 2-carboxypropyl (meth) acrylate, and 3-carboxypropyl (meth)acrylate; unsaturated nitryl compounds such as (meth) acrylonitrile, α-chloroacrylonitrile, crotonitrile, maleinitrile, and fumaronitrile; unsaturated amide compounds such as (meth)acrylamide, N,N-dimethyl (meth)acrylamide, crotonamide, maleinamide, and fumaramide; unsaturated imide compounds such as maleimide, N-phenylmaleimide, and N-cyclohexylmaleimide; and other nitrogen-containing vinyl compounds such as N-vinyl-ε-caprolactam, N-vinylpyrrolidone, 2-vinylpyridine, 3-vinylpyridine, 4-vinylpyridine, 2-vinylimidazole, and 4-vinylimidazole.

Of these other recurring units, units obtainable by cleavage of a polymerizable unsaturated bond in the compound such as α-methylstyrene, 4-(2-t-butoxycarbonylethyloxy) styrene, a monomer of the above formula (5), or a monomer of the above formula (6) are preferable.

The resin (B) can be prepared, for example, by introducing one or more acid-dissociable groups into an alkali-soluble resin, by (co)polymerization of monomers containing one or more acid-dissociable groups, or by (co) polycondensation of polycondensable components containing one or more acid-dissociable groups.

The amount of the acid-dissociable groups introduced into the resin (B) (the amount of the number of the acid-dissociable groups in the total number of non-protected acid functional groups and acid-dissociable groups in the resin (B)) is preferably 10–60%, and still more preferably 15–50%, although the amount varies depending on the types of acid-dissociable groups and the alkali-soluble resin into which the acid-dissociable groups are introduced.

The polystyrene-reduced weight average molecular weight (hereinafter referred to as "Mw") of the resin (B) determined by gel permeation chromatography (GPC) is preferably 1,000–150,000, and more preferably 3,000–100,000.

The ratio of Mw to the polystyrene-reduced number average molecular weight (hereinafter referred to as "Mn") determined by gel permeation chromatography (Mw/Mn) of the resin (B) is usually 1–10, and preferably 1–5.

In the present invention, the resin (B) may be used either individually or in combination of two or more.

Component (C)

The component (C) of the present invention is a photoacid generator which generates an acid upon exposure (hereinafter referred to as "acid generator (C)"). The compound of the following formula (4) (hereinafter referred to as "an acid generator (4)") can be given as a preferable acid generator (C) of the present invention,

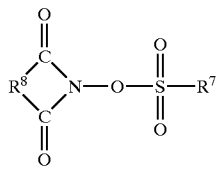

(4)

wherein R$^7$ is a monovalent organic group and R$^8$ is a divalent organic group.

Examples of the acid generator (4) include:
N-(trifluoromethylsulfonyloxy) succinimide,
N-(trifluoromethylsulfonyloxy)phthalimide,
N-(trifluoromethylsulfonyloxy)diphenylmalelmide,
N-(trifluoromethylsulfonyloxy)bicyclo[2.2.1]hept-5-ene-2,3-dicarboxyimide,
N-(trifluoromethylsulfonyloxy)-7-oxabicyclo[2.2.1]hept-5-ene-2,3-dicarboxyimide,
N-(trifluoromethylsulfonyloxy)bicyclo[2.2.1]heptan-5,6-oxy-2,3-dicarboxyimide,
N-(trifluoromethylsulfonyloxy)naphthylimide,
N-(10-camphorsulfonyloxy)succinimide,
N-(10-camphorsulfonyloxy)phthaimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide,
N-(10-camphorsulfonyloxy)naphthylimide,
N-(n-octanesulfonyloxy)succinimide,
N-(n-octanesulfonyloxy)phthalimide,
N-(n-octanesulfonyloxy)diphenylmaleimide,
N-(n-octanesulfonyloxy)bicyclo[2.2.1]hept-5-ene-2,3-dicarboxyimide,
N-(n-octanesulfonyloxy)-7-oxabicyclo[2.2.1]hept-5-ene-2,3-dicarboxyimide,
N-(n-octanesulfonyloxy)bicyclo[2.2.1]heptane-5,6-oxy-2,3-dicarboxyimide, N-(n-octanesulfonyloxy)naphthylimide,
N-(p-toluenesulfonyloxy)succinimide,
N-(p-toluenesulfonyloxy)phthalimide,
N-(p-toluenesulfonyloxy)diphenylmaleimide,
N-(p-toluenesulfonyloxy)bicyclo[2.2.1]hept-5-ene-2,3-dicarboxyimide,
N-(p-toluenesulfonyloxy)-7-oxabicyclo[2.2.1]hept-5-ene-2,3-dicarboxyimide,
N-(p-toluenesulfonyloxy)bicyclo[2.2.1]heptane-5,6-oxy-2,3-dicarboxyimide,
N-(p-toluenesulfonyloxy)naphthylimide,
N-(2-trifluoromethylbenzenesulfonyloxy)succinimide,
N-(2-trifluoromethylbenzenesulfonyloxy)phthalimide,
N-(2-trifluoromethylbenzenesulfonyloxy)diphenylmaleiide,
N-(2-trifluoromethylbenzenesulfonyloxy)bicyclo[2.2.1]hept-5-ene-2,3-dicarboxyimide,
N-(2-trifluoromethylbenzenesulfonyloxy)-7-oxabicyclo-[2.2.1]hept-5-ene-2,3-dicarboxyimide,
N-(2-trifluoromethylbenzenesulfonyloxy)bicyclo-[2.2.1]heptan-5,6-oxy-2,3-dicarboxyimide,
N-(2-trifluoromethylbenzenesulfonyloxy)naphthylimide,
N-(4-trifluoromethylbenzenesulfonyloxy)succinimide,
N-(4-trifluoromethylbenzenesulfonyloxy)phthalimide,
N-(4-trifluoromethylbenzenesulfonyloxy)diphenylmaleimide,
N-(4-trifluoromethylbenzenesulfonyloxy)bicyclo[2.2.1]hept-5-ene-2,3-dicarboxyimide,
N-(4-trifluoromethylbenzenesulfonyloxy)-7-oxabicyclo-[2.2.1]hept-5-ene-2,3-dicarboxyimide,
N-(4-trifluoromethylbenzenesulfonyloxy)bicyclo[2.2.1]-heptane-5,6-oxy-2,3-dicarboxyimide,
N-(4-trifluoromethylbenzenesulfonyloxy)naphthylimide,
N-(perfluorobenzenesulfonyloxy)succinimide,
N-(perfluorobenzenesulfonyloxy)phthalimide,
N-(perfluorobenzenesulfonyloxy)diphenylmaleimide,
N-(perfluorobenzenesulfonyloxy)bicyclo[2.2.1]hept-5-ene-2,3-dicarboxyimide,
N-(perfluorobenzenesulfonyloxy)-7-oxabicyclo[2.2.1]hept-5-ene-2,3-dicarboxyimide,
N-(perfluorobenzenesulfonyloxy)bicyclo[2.2.1]heptan-5,6-oxy-2,3-dicarboxyimide,
N-(perfluorobenzenesulfonyloxy)naphthylimide,
N-(naphthalenesulfonyloxy)succinimide,
N-(naphthalenesulfonyloxy)phthalimide,
N-(naphthalenesulfonyloxy)diphenylmaleimide,
N-(naphthalenesulfonyloxy)bicyclo[2.2.1]hept-5-ene-2,3-dicarboxyimide,
N-(naphthalenesulfonyloxy)-7-oxabicyclo[2.2.1]hept-5-ene-2,3-dicarboxyimide,
N-(naphthalenesulfonyloxy)bicyclo[2.2.1]heptan-5,6-oxy-2,3-dicarboxyimide,
N-(naphthalenesulfonyloxy)naphthylimide,
N-{(5-methyl-5-methoxycarbonylbicyclo[2,2,1]heptan-2-yl)-sulfonyloxy}succinimide,
N-{(5-methyl-5-methoxycarbonylbicyclo[2,2,1]heptan-2-yl)-sulfonyloxy}bicyclo[2.2.1]hept-5-ene-2,3dicarboxyimide,
N-(nonafluoro-n-butanesulfonyloxy)succinimide,
N-(nonafluoro-n-butanesulfonyloxy)phthalimide,
N-(nonafluoro-n-butanesulfonyloxy)diphenylmaleimide,
N-(nonafluoro-n-butanesulfonyloxy)bicyclo[2.2.1]hept-5-ene-2,3-dicarboxyimide,
N-(nonafluoro-n-butanesulfonyloxy)-7-oxabicyclo[2.2.1]hept-5-ene-2,3-dicarboxyimide,
N-(nonafluoro--n-butanesulfonyloxy)bicyclo[2.2.1]heptan5,6-oxy-2,3-dicarboxyimide,
N-(nonafluoro-n-butanesulfonyloxy)naphthylimide,
N-(perfluoro-n-octanesulfonyloxy)succinimide, N-(perfluoro-n-octanesulfonyloxy)phthalimide,
N-(perfluoro-n-octanesulfonyloxy)diphenylmaleimide,
N-(perfluoro-n-octanesulfonyloxy)bicyclo[2.2.1]hept-5-ene-2,3-dicarboxyimide,
N-(perfluoro-n-octanesulfonyloxy)-7-oxabicyclo[2.2.1]hept-5-ene-2, 3-dicarboxyimide,
N-(perfluoro-n-octanesulfonyloxy)bicyclo[2.2.1]heptane-5,6-oxy-2,3-dicarboxyimide,
N-(perfluoro-n-octanesulfonyloxy) naphthylimide,
N-(benzenesulfonyloxy) succinimide,
N-(benzenesulfonyloxy)phthalimide,
N-(benzenesulfonyloxy)diphenylmaleimide,
N-(benzenesulfonyloxy)bicyclo[2.2.1]hept-5-ene-2,3-dicarboxyimide,
N-(benzenesulfonyloxy)-7-oxabicyclo[2.2.1]hept-5-ene-2, 3-dicarboxyimide,
N-(benzenesulfonyloxy)bicyclo[2.2.1]heptan-5,6-oxy-2,3-dicarboxyimide, N-(benzenesulfonyloxy)naphthylimide,
and the like.

Of these acid generators (4), N-(trifluoromethylsulfonyloxy)bicyclo[2.2.1]hept-5-ene-2,3-dicarboxyimide,
N-(10-camphorsulfonyloxy)succinimide,
N-(10-camphorsulfonyloxy)bicyclo[2.2.1]hept-5-ene-2, 3dicarboxyimide,
N-{(5-methyl-5-methoxycarbonylbicyclo[2,2,1]heptan-2-yl)-sulfonyloxy}succinimide,
N-{(5-methyl-5-methoxycarbonylbicyclo[2,2,1]heptan-2-yl)-sulfonyloxy}bicyclo[2.2.1]hept-5-ene-2,3-dicarboyimide,
N-(nonafluoro-n-butanesulfonyloxy)bicyclo[2.2.1]hept-5-ene-2,3-dicarboxyimide, and the like are preferable.

The acid generators (4) may be used either individually or in combination of two or more.

As acid generators (C) other than the acid generators (4) (hereinafter called "other acid generators (C)"), onium salts, sulfone compounds, sulfonate compounds, disulfonyldiazomethane compound, disulfonylmethane compound, oxime sulfonate compound, hydrazine sulfonate compound, and the like can be given. Examples of these other acid generators (C) are as follows:

Onium Salts

As examples of onium salts, iodonium salt, sulfonium salt, phosphonium salt, diazonium salt, ammonium salt, pyridinium salt, and the like can be given. Specific examples of onium salts include:
bis(4-t-butylphenyl)iodonium trifluoromethanesulfonate,
bis(4-t-butylphenyl)iodonium nonafluoro-n-butanesulfonate,
bis(4-t-butylphenyl)iodonium perfluoro-n-octanesulfonate,
bis(4-t-butylphenyl)iodonium pyrenesulfonate,
bis(4-t-butylphenyl)iodonium n-dodecylbenzenesulfonate,
bis(4-t-butylphenyl)iodonium p-toluenesulfonate,
bis(4-t-butylphenyl)iodonium benzenesulfonate,
bis(4-t-butylphenyl)iodonium 10-camphorsulfonate,
bis(4-t-butylphenyl)iodonium n-octanesulfonate,
bis(4-t-butylphenyl)iodonium 2-trifluoromethylbenzenesulfonate,
bis(4-t-butylphenyl)iodonium 4-trifluoromethylbenzenesulfonate,
bis(4-t-butylphenyl)iodonium perfluorobenzenesulfonate,
diphenyliodonium trifluoromethanesulfonate,
diphenyliodonium nonafluoro-n-butanesulfonate,
diphenyliodonium perfluoro-n-octanesulfonate,
diphenyliodonium pyrenesulfonate,
diphenyliodonium n-dodecylbenzenesulfonate,
diphenyliodonium p-toluenesulfonate,
diphenyliodonium benzenesulfonate,
diphenyliodonium 10-camphorsulfonate,
diphenyliodonium n-octanesulfonate,
diphenyliodonium 2-trifluoromethylbenzenesulfonate,
diphenyliodonium 4-trifluoromethylbenzenesulfonate,
diphenyliodonium perfluorobenzenesulfonate,
di(p-tolyl)iodonium trifluoromethanesulfonate,
di(p-tolyl)iodonium nonafluoro-n-butanesulfonate,
di(p-tolyl)iodonium perfluoro-n-octanesulfonate,
di(p-tolyl)iodonium pyrenesulfonate,
di(p-tolyl)iodonium n-dodecylbenzenesulfonate,
di(p-tolyl)iodonium p-toluenesulfonate,
di(p-tolyl)iodonium benzenesulfonate,
di(p-tolyl)iodonium 10-camphorsulfonate,
di(p-tolyl)iodonium n-octanesulfonate,
di(p-tolyl)iodonium 2-trifluoromethylbenzenesulfonate,
di(p-tolyl)iodonium 4-trifluoromethylbenzenesulfonate,
di(p-tolyl)iodonium perfluorobenzenesulfonate,
di(3,4-dimethylphenyl)iodonium trifluoromethanesulfonate,
di(3,4-dimethylphenyl)iodonium nonafluoro-n-butanesulfonate,
di(3,4-dimethylphenyl)iodonium perfluoro-n-octanesulfonate,
di(3,4-dimethylphenyl)iodonium pyrenesulfonate,
di(3,4-dimethylphenyl)iodonium n-dodecylbenzenesulfonate,
di(3,4-dimethylphenyl)iodonium p-toluenesulfonate,
di(3,4-dimethylphenyl)iodonium benzenesulfonate,
di(3,4-dimethylphenyl)iodonium 10-camphorsulfonate,
di(3,4-dimethylphenyl)iodonium n-octanesulfonate,
di(3,4-dimethylphenyl)iodonium 2-trifluoromethylbenzenesulfonate,
di(3,4-dimethylphenyl)iodonium 4-trifluoromethylbenzenesulfonate,
di(3,4-dimethylphenyl)iodonium perfluorobenzenesulfonate,
4-nitrophenyl.phenyliodonium trifluoromethanesulfonate,
4-nitrophenyl.phenyliodonium nonafluoro-n-butanesulfonate,
4-nitrophenyl.phenyliodonium perfluoro-n-octanesulfonate,
4-nitrophenyl.phenyliodonium pyrenesulfonate,
4-nitrophenyl.phenyliodonium n-dodecylbenzenesulfonate,
4-nitrophenyl.phenyliodonium p-toluenesulfonate,
4-nitrophenyl.phenyliodonium benzenesulfonate,
4-nitrophenyl.phenyliodonium 10-camphorsulfonate,
4-nitrophenyl.phenyliodonium n-octanesulfonate,
4-nitrophenyl.phenyliodonium 2-trifluoromethylbenzenesulfonate,
4-nitrophenyl.phenyliodonium 4-trifluoromethylbenzenesulfonate,
4-nitrophenyl.phenyliodonium perfluorobenzenesulfonate,
di(3-nitrophenyl)iodonium trifluoromethanesulfonate,
di(3-nitrophenyl)iodonium nonafluoro-n-butanesulfonate,
di(3-nitrophenyl)iodonium perfluoro-n-octanesulfonate,
di(3-nitrophenyl)iodonium pyrenesulfonate,
di(3-nitrophenyl)iodonium n-dodecylbenzenesulfonate,
di(3-nitrophenyl)iodonium p-toluenesulfonate,
di(3-nitrophenyl)iodonium benzenesulfonate,
di(3-nitrophenyl)iodonium 10-camphorsulfonate,
di(3-nitrophenyl)iodonium n-octanesulfonate,
di(3-nitrophenyl)iodonium 2-trifluoromethylbenzenesulfonate,
di(3-nitrophenyl)iodonium 4-trifluoromethylbenzenesulfonate,
di(3-nitrophenyl)iodonium perfluorobenzenesulfonate,
4-methoxyphenyl.phenyliodonium trifluoromethanesulfonate, 4-methoxyphenyl.phenyliodonium nonafluoro-n-butanesulfonate,
4-methoxyphenyl.phenyliodonium perfluoro-n-octanesulfonate,
4-methoxyphenyl.phenyliodonium pyrenesulfonate,
4-methoxyphenyl.phenyliodonium n-dodecylbenzenesulfonate,
4-methoxyphenyl.phenyliodonium p-toluenesulfonate,
4-methoxyphenyl.phenyliodonium benzenesulfonate,
4-methoxyphenyl.phenyliodonium 10-camphorsulfonate,
4-methoxyphenyl.phenyliodonium n-octanesulfonate,
4-methoxyphenyl.phenyliodonium 2-trifluoromethylbenzenesulfonate,
4-methoxyphenyl.phenyliodonium 4-trifluoromethylbenzenesulfonate,
4-methoxyphenyl.phenyliodonium perfluorobenzenesulfonate,
di(4-chlorophenyl)iodonium trifluoromethane sulfonate,
di(4-chlorophenyl)iodonium nonafluoro-n-butanesulfonate,
di(4-chlorophenyl)iodonium perfluoro-n-octanesulfonate,
di(4-chlorophenyl)iodonium pyrenesulfonate,
di(4-chlorophenyl)iodonium n-dodecylbenzenesulfonate,
di(4-chlorophenyl)iodonium p-toluenesulfonate,
di(4-chlorophenyl)iodonium benzenesulfonate,
di(4-chlorophenyl)iodonium 10-camphorsulfonate,
di(4-chlorophenyl)iodonium n-octanesulfonate,
di(4-chlorophenyl)iodonium 2-trifluoromethylbenzenesulfonate,
di(4-chlorophenyl)iodonium 4-trifluoromethylbenzenesulfonate,
di(4-chlorophenyl)iodonium perfluorobenzenesulfonate,
di(4-trifluoromethylphenyl)iodonium trifluoromethanesulfonate,
di(4-trifluoromethylphenyl)iodonium nonafluoro-n-butanesulfonate,
di(4-trifluoromethylphenyl)iodonium perfluoro-n-octanesulfonate,
di(4-trifluoromethylphenyl)iodonium pyrenesulfonate,
di(4-trifluoromethylphenyl)iodonium n-dodecylbenzenesulfonate,
di(4-trifluoromethylphenyl)odonium p-toluenesulfonate,
di(4-trifluoromethylphenyl)iodonium benzenesulfonate,
di(4-trifluoromethylphenyl)iodonium 10-camphorsulfonate,
di(4-trifluoromethylphenyl)iodonium n-octanesulfonate,
di(4-trifluoromethylphenyl)iodonium 2-trifluoromethylbenzenesulfonate,
di(4-trifluoromethylphenyl)iodonium 4-trifluoromethylbenzenesulfonate,
di(4-trifluoromethylphenyl)iodonium perfluorobenzenesulfonate,
dinaphthyliodonium trifluoromethanesulfonate,
dinaphthyliodonium nonafluoro-n-butanesulfonate,
dinaphthyliodonium perfluoro-n-octanesulfonate,
dinaphthyliodonium pyrenesulfonate,
dinaphthyliodonium n-dodecylbenzenesulfonate,
dinaphthyliodonium p-toluenesulfonate,
dinaphthyliodonium benzenesulfonate,
dinaphthyliodonium 10-camphorsulfonate,
dinaphthyliodonium n-octanesulfonate,
dinaphthyliodonium 2-trifluoromethylbenzenesulfonate,
dinaphthyliodonium 4-trifluoromethylbenzenesulfonate,
dinaphthyliodonium perfluorobenzenesulfonate,
biphenyleneiodonium trlifluoromethanesulfonate,
biphenyleneiodonium nonafluoro-n-butanesulfonate,
biphenyleneiodonium perfluoro-n-octanesulfonate,
biphenyleneiodonium pyrenesulfonate,
biphenyleneiodonium n-dodecylbenzenesulfonate,
biphenyleneiodonium p-toluenesulfonate,
biphenyleneiodonium benzenesulfonate,
biphenyleneiodonium 10-camphorsulfonate,
biphenyleneiodonium n-octanesulfonate,
biphenyleneiodonium 2-trifluoromethylbenzenesulfonate,
biphenyleneiodonium 4-trifluoromethylbenzenesulfonate,
biphenyleneiodonium perfluorobenzenesulfonate,
2-chlorobiphenyleneiodonium trifluoromethanesulfonate,
2-chlorobiphenyleneiodonium nonafluoro-n-butanesulfonate,
2-chlorobiphenyleneiodonium perfluoro-n-octanesulfonate,
2-chlorobiphenyleneiodonium pyrenesulfonate,
2-chlorobiphenyleneiodonium n-dodecylbenzenesulfonate,
2-chlorobiphenyleneiodonium p-toluenesulfonate,
2-chlorobiphenyleneiodonium benzenesulfonate,
2-chlorobiphenyleneiodonium 10-camphorsulfonate,
2-chlorobiphenyleneiodonium n-octanesulfonate,
2-chlorobiphenyleneiodonium 2-trifluoromethylbenzenesulfonate,
2-chlorobiphenyleneiodonium 4-trifluoromethylbenzenesulfonate,
2-chlorobiphenyleneiodonium perfluorobenzenesulfonate,
triphenylsulfonium trifluoromethanesulfonate,
triphenylsulfonium nonafluoro-n-butanesulfonate,
triphenylsulfonium perfluoro-n-octanesulfonate,
triphenylsulfonium pyrenesulfonate,
triphenylsulfonium n-dodecylbenzenesulfonate,
triphenylsulfonium p-toluenesulfonate,
triphenylsulfonium benzenesulfonate,
triphenylsulfonium 10-camphorsulfonate,
triphenylsulfonium n-octanesulfonate,
triphenylsulfonium 2-trifluoromethylbenzenesulfonate,
triphenylsulfonium 4-trifluoromethylbenzenesulfonate,
triphenylsulfonium hexafluoroantimonate,
triphenylsulfonium naphthalenesulfonate,
triphenylsulfonium perfluorobenzenesulfonate,
4-t-butylphenyl.diphenylsulfonium trifluoromethanesulfonate,
4-t-butylphenyl.diphenylsulfonium nonafluoro-n-butanesulfonate,
4-t-butylphenyl.diphenylsulfonium perfluoro-n-octanesulfonate,
4-t-butylphenyl.diphenylsulfonium pyrenesulfonate,
4-t-butylphenyl.diphenylsulfonium n-dodecylbenzenesulfonate,
4-t-butylphenyl.diphenylsulfonium p-toluenesulfonate,
4-t-butylphenyl.diphenylsulfonium benzenesulfonate,
4-t-butylphenyl.diphenylsulfonium 10-camphorsulfonate,
4-t-butylphenyl.diphenylsulfonium n-octanesulfonate,
4-t-butylphenyl.diphenylsulfonium 2-trifluoromethylbenzenesulfonate,
4-t-butylphenyl.diphenylsulfonium 4-trifluoromethanebenzenesulfonate,
4-t-butylphenyl.diphenylsulfonium perfluorobenzenesulfonate,
4-t-butoxyphenyl.diphenylsulfonium trifluoromethanesulfonate,
4-t-butoxyphenyl.diphenylsulfonium nonafluoro-n-butanesulfonate,
4-t-butoxyphenyl.diphenylsulfonium perfluoro-n-octanesulfonate,
4-t-butoxyphenyl.diphenylsulfonium pyrenesulfonate,
4-t-butoxyphenyl.diphenylsulfonium n-dodecylbenzenesulfonate,
4-t-butoxyphenyl.diphenylsulfonium p-toluenesulfonate,
4-t-butoxyphenyl.diphenylsulfonium benzenesulfonate,
4-t-butoxyphenyl.diphenylsulfonium 10-camphorsulfonate, 4-t-butoxyphenyl.diphenylsulfonium n-octanesulfonate,
4-t-butoxyphenyl.diphenylsulfonium 2-trifluoromethylbenzenesulfonate,
4-t-butoxyphenyl.diphenylsulfonium 4-trifluoromethyl.benzenesulfonate,
4-t-butoxyphenyl.diphenylsulfonium perfluorobenzenesulfonate,
b    4-hydroxyphenyl.diphenylsufonium trifluoromethanesulfonate,
4-hydroxyphenyl.diphenylsulfonium nonafluoro-n-butanesulfonate,
4-hydroxyphenyl.diphenylsulfonium perfluoro-n-octanesulfonate,
4-hydroxyphenyl.diphenylsulfonium pyrenesulfonate,
4-hydroxyphenyl.diphenylsulfonium n-dodecylbenzenesulfonate,
4-hydroxyphenyl.diphenylsulfonium p-toluenesulfonate,
4-hydroxyphenyl.diphenylsulfonium benzenesulfonate,
4-hydroxyphenyl.diphenylsulfonium 10-camphorsulfonate,
4-hydroxyphenyl.diphenylsulfonium n-octanesulfonate,
4-hydroxyphenyl.diphenylsulfonium 2-trifluoromethylbenzenesulfonate,
4-hydroxyphenyl.diphenylsulfonium 4-trifluoromethylbenzenesulfonate,
perfluorobenzenesulfonate,
tri(4-methoxyphenyl)sulfonium trifluoromethanesulfonate,
tri(4-methoxyphenyl)sulfonium nonafluoro-n-butanesulfonate,
tri(4-methoxyphenyl) sulfonium perfluoro-n-octanesulfonate,
tri(4-methoxyphenyl)sulfonium pyrenesulfonate,
tri(4-methoxyphenyl)sulfonium n-dodecylbenzenesulfonate,
tri(4-methoxyphenyl)sulfonium p-toluenesulfonate,
tri(4-methoxyphenyl)sulfonium benzenesulfonate,
tri(4-methoxyphenyl)sulfonium 10-camphorsulfonate,
tri(4-methoxyphenyl) sulfonium n-octanesulfonate,
tri(4-methoxyphenyl)sulfonium 2-trifluoromethylbenzenesulfonate,
tri(4-methoxyphenyl)sulfonium 4-trifluoromethylbenzenesulfonate,
tri(4-methoxyphenyl)sulfonium perfluorobenzenesulfonate,
di(4-methoxyphenyl).p-tolylsulfonium trifluoromethanesulfonate,
di(4-methoxyphenyl).p-tolylsulfonium nonafluoro-n-butanesulfonate,
di(4-methoxyphenyl).p-tolylsulfonium perfluoro-n-octanesulfonate,
di(4-methoxyphenyl).p-tolylsulfonium pyrenesulfonate,
di(4-methoxyphenyl).p-tolylsulfonium n-dodecylbenzenesulfonate,
di(4-methoxyphenyl).p-tolylsulfonium p-toluenesulfonate,
di(4-methoxyphenyl).p-tolylsulfonium benzenesulfonate,
di(4-methoxyphenyl).p-tolylsulfonium 10-camphorsulfonate,
di(4-methoxyphenyl).p-tolylsulfonium n-octanesulfonate,
di(4-methoxyphenyl).p-tolylsulfonium 2-trifluoromethylbenzenesulfonate,
di(4-methoxyphenyl).p-tolylsulfonium 4-trifluoromethylbenzenesulfonate,
di(4-methoxyphenyl).p-tolylsulfonium perfluorobenzenesulfonate,
phenyl.tetramethylenesulfonium trifluoromethanesulfonate,
phenyl.tetramethylenesulfonium nonafluoro-n-butanesulfonate,
phenyl.tetramethylenesulfonium perfluoro-n-octanesulfonate,
phenyl.tetramethylenesulfonium pyrenesulfonate,
phenyl.tetramethylenesulfonium n-dodecylbenzenesulfonate,
phenyl.tetramethylenesulfonium p-toluenesulfonate,
phenyl.tetramethylenesulfonium benzenesulfonate,
phenyl.tetramethylenesulfonium 10-camphorsulfonate,
phenyl.tetramethylenesulfonium n-octanesulfonate,
phenyl.tetramethylenesulfonium 2-trifluoromethylbenzenesulfonate,
phenyl.tetramethylenesulfonium 4-trifluoromethylbenzenesulfonate,
phenyl.tetramnethylenesulfonium perfluorobenzenesulfonate,
4-hydroxyphenyl.tetramethylenesulfonium trifluoromethanesulfonate,
4-hydroxyphenyl.tetramethylenesulfonium nonafluoro-n-butanesulfonate,
4-hydroxyphenyl.tetramethylenesulfonium perfluoro-n-octanesulfonate,
4-hydroxyphenyl.tetramethylenesulfonium pyrenesulfonate,
4-hydroxyphenyl.tetramethylenesulfonium n-dodecylbenzenesulfonate,
4-hydroxyphenyl-tetramethylenesulfonium p-toluenesulfonate,
4-hydroxyphenyl.tetramethylenesulfonium benzenesulfonate,
4-hydroxyphenyl.tetramethylenesulfonium 10-camphorsulfonate,
4-hydroxyphenyl.tetramethylenesulfonium n-octanesulfonate,
4-hydroxyphenyl.tetramethylenesulfonium 2-trifluoromethylbenzenesulfonate,
4-hydroxyphenyl.tetramethylenesulfonium 4-trifluoromethylbenzenesulfonate,
4-hydroxyphenyl.tetramethylenesulfonium perfluorobenzenesulfonate,
phenyl.biphenylenesulfonium trifluoromethanesulfonate,
phenyl.biphenylenesulfonium nonafluoro-n-butanesulfonate,
phenyl.biphenylenesulfonium perfluoro-n-octanesulfonate,
phenyl.biphenylenesulfonium pyrenesulfonate,
phenyl.biphenylenesulfonium n-dodecylbenzenesulfonate,
phenyl.biphenylenesulfonium p-toluenesulfonate,
phenyl.biphenylenesulfonium benzenesulfonate,
phenyl.biphenylenesulfonium 10-camphorsulfonate,
phenyl.biphenylenesulfonium n-octanesulfonate,
phenyl-biphenylenesulfonium 2-trifluoromethylbenzenesulfonate,
phenyl.biphenylenesulfonium 4-trifluoromethylbenzenesulfonate,
phenyl.biphenylenesulfonium perfluorobenzenesulfonate,
(4-phenylthiophenyl) diphenylsulfonium trifluoromethanesulfonate,
(4-phenylthiophenyl) diphenylsulfonium nonafluoro-n-butanesulfonate,
(4-phenylthiophenyl).diphenylsulfonium perfluoro-n-octanesulfonate,
(4-phenylthiophenyl).diphenylsulfonium pyrenesulfonate,
(4-phenylthiophenyl).diphenylsulfonium n-dodecylbenzenesulfonate,
(4-phenylthiophenyl).diphenylsulfonium p-toluenesulfonate,
(4-phenylthiophenyl).diphenylsulfonium benzenesulfonate,
(4-phenylthiophenyl).diphenylsulfonium 10-camphorsulfonate,
(4-phenylthiophenyl).diphenylsulfonium n-octanesulfonate,
(4-phenylthiophenyl).diphenylsulfonium 2-trifluoromethylbenzenesulfonate, (4-phenylthiophenyl).diphenylsulfonium 4-trifluoromethylbenzenesulfonate,
(4-phenylthiophenyl).diphenylsulfonium perfluorobenzenesulfonate,
4,4'-bis(diphenylsulfoniophenyl)sulfide di(trifluoromethanesulfonate),
4,4'-bis(diphenylsulfoniophenyl)sulfide di(nonafluoro-n-butanesulfonate),
4,4'-bis(diphenylsulfoniophenyl)sulfide di(perfluoro-n-octanesulfonate),
4,4'-bis(diphenylsulfoniophenyl)sulfide di(pyrenesulfonate),
4,4'-bis(diphenylsulfoniophenyl)sulfide di(n-dodecylbenzenesulfonate),
4,4'-bis(diphenylsulfoniophenyl)sulfide di(p-toluenesulfonate),
4,4'-bis(diphenylsulfoniophenyl)sulfide di(benzenesulfonate),
4,4'-bis(diphenylsulfoniophenyl)sulfide di(10-camphorsulfonate),
4,4'-bis(diphenylsulfoniophenyl)sulfide di(n-octanesulfonate),
4,4'-bis(diphenylsulfoniophenyl)sulfide di(2-trifluoromethylbenzenesulfonate),
4,4'-bis(diphenylsulfoniophenyl)sulfide di(4-trifluoromethylbenzenesulfonate),
4,4'-bis(diphenylsulfoniophenyl)sulfide di(perfluorobenzenesulfonate), and the like.

Sulfone Compounds

As examples of sulfone compounds, β-ketosulfone, β-sulfonylsulfone, and α-diazo compounds of these compounds can be given.

As specific examples of sulfone compounds, phenacylphenylsulfone, mesitylphenacylsulfone, bis(phenylsulfonyl)methane, and 4-trisphenacylsulfone can be given.

Sulfonate Compounds

As examples of sulfonate compounds, alkyl sulfonate, haloalkyl sulfonate, aryl sulfonate, and imino sulfonate can be given.

As specific examples of sulfonate compounds, benzointosylate, pyrogallol tristrifluoromethanesulfonate, pyrogallol trisnonafluorobutanesufonate, pyrogallol methanetrisulfonate, nitrobenzyl-9,10-diethoxyanthracene-2-sulfonate, α-methylolbenzointosylate, α-methylolbenzoin octanesulfonate, α-methylolbenzoin trifluoromethanesulfonate, α-methylolbenzoin dodecylsulfonate, and the like can be given.

Diazomethane Compounds

As examples of diazomethane compounds, a compound shown by the following formula (8) and the like can be given:

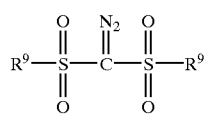

(8)

wherein $R^9$ individually represents a monovalent group such as an alkyl group, aryl group, halogenated alkyl group, and halogenated aryl group.

As specific examples of diazomethane compounds,
bis(trifluoromethylsulfonyl) diazomethane,
bis(cyclohexylsulfonyl) diazomethane,
bis(phenylsulfonyl) diazomethane,
bis(p-toluenesulfonyl) diazomethane,
bis(2,4-dimethylbenzenesulfonyl) diazomethane,
methylsulfonyl-p-toluenesulfonyldiazomethane,
bis(4-t-butylphenylsulfonyl) diazomethane,
bis(p-chlorobenzenesulfonyl) diazomethane,
cyclohexylsulfonyl-p-toluenesulfonyldiazomethane,
(cyclohexylsulfonyl)(1,1-dimethylethylsulfonyl)-diazomethane,
bis(1,1-dimethylethylsulfonyl)diazomethane,
bis(1-methylethylsulfonyl)diazomethane,
bis(3,3-dimethyl-1,5-dioxaspiro[5.5]dodecane-8-sulfonyl)-diazomethane,
bis(1,4-dioxaspiro[4.5]decane-7-sulfonyl)diazomethane, and the like can be given.

Disulfonylmethane Compounds

As disulfonylmethane compounds, a compound of the following formula (9), for example, can be given:

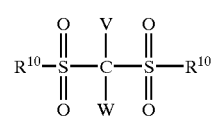

(9)

wherein $R^{10}$ individually represents a linear or branched monovalent aliphatic hydrocarbon group, cycloalkyl group, aryl group, aralkyl group, or other monovalent organic group having a hetero atom, and V and W individually represent an aryl group, a hydrogen atom, a linear or branched monovalent aliphatic hydrocarbon group, or a monovalent organic group having a hetero atom, provided that at least one of V and W represents an aryl group, or V and W bond to form a monocyclic or polycyclic structure having at least one unsaturated bond, or V and W bond to form a group of the following formula (10):

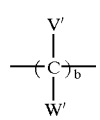

(10)

wherein V' and W' individually represent a hydrogen atom, halogen atom, an alkyl group, cycloalkyl group, aryl group, or aralkyl group, or V' and W' each bonded to the same or different carbon atoms bond to form a monocyclic carbon structure, and b is an integer from 2 to 10.

Oxime Sulfonate Compounds

As examples of oxime sulfonate compounds, compounds of the following formulas (11) or (12) can be given:

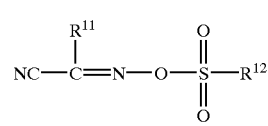

(11)

wherein $R^{11}$ and $R^{12}$ individually represent a monovalent organic group,

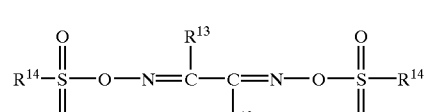

(12)

wherein $R^{13}$ and $R^{14}$ individually represent a monovalent organic group.

As specific examples of $R^{11}$ in the formula (11), a methyl group, ethyl group, n-propyl group, phenyl group, tosyl group, trifluoromethyl group, and nonafluoro-n-butyl group can be given.

As specific examples of $R^{12}$, a phenyl group, tosyl group, and naphthyl group can be given.

As specific examples of $R^{13}$ in the formula (12), a methyl group, ethyl group, n-propyl group, phenyl group, tosyl group, trifluoromethyl group, and nonafluoro-n-butyl group can be given.

As specific examples of $R^{14}$, a phenyl group, tosyl group, and naphthyl group can be given.

Hydrazinesulfonate Compounds

As examples of hydrazinesulfonate compounds, bis(benzene)sulfonylhydrazine, bis(p-toluene)sulfonylhydrazine, bis(trifluoromethane)sulfonylhydrazine, bis(nonafluoro-n-butane)sulfonylhydrazine, bis(n-propane)sulfonylhydrazine, benzenesulfonylhydrazine, p-toluenesulfonylhydrazine, trifluoromethanesulfonylhydrazine, nonafluoro-n-butanesulfonylhydrazine, n-propanesulfonylhydrazine, trifluoromethanesulfonyl p-toluenesulfonylhydrazine, and the like can be given.

These other acid generators (C) may be used either individually or in combination of two or more.

The amount of the acid generator (C) used is preferably 0.1–20 parts by weight, and more preferably 0.5–15 parts by weight, for 100 parts by weight of the resin (B).

Other Components

Acid Diffusion Controller

It is preferable to add an acid diffusion controller to the radiation-sensitive resin composition of the present invention. The acid diffusion controller controls diffusion of an acid generated from the acid generator (C) upon exposure in the resist film to hinder unfavorable chemical reactions in the unexposed area.

The addition of the-acid diffusion controller improves storage stability of the composition and resolution as a resist. Moreover, the addition of the acid diffusion controller prevents the line width of the resist pattern from changing due to variation of post-exposure delay (PED) from exposure to post-exposure heat treatment, whereby a composition with remarkably superior process stability can be obtained.

As the acid diffusion controller, organic compounds containing nitrogen of which the basicity does not change during exposure or heating for forming a resist pattern are preferable.

As examples of such nitrogen-containing organic compounds, a compound shown by the following formula (13) (hereinafter called "nitrogen-containing compound (I)"),

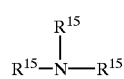

(13)

(wherein $R^{15}$ individually represents a hydrogen atom, alkyl group, aryl group, or aralkyl group which are either unsubstituted or substituted by a functional group such as a hydroxyl group), a diamino compound having two nitrogen atoms in the molecule (hereinafter referred to as "nitrogen-containing compound (II)"), a diamino polymer having three or more nitrogen atoms in the molecule (hereinafter referred to as "nitrogen-containing compound (III)"), an amide group-containing compound, urea compound, nitrogen-containing heterocyclic compound, and the like can be given.

Examples of the nitrogen-containing compound (I) include monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; alkanolamines such as ethanolamine, diethanolamine, and triethanolamine; and aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine.

Examples of the nitrogen-containing compounds (II) include ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1-bis[1-(4-aminophenyl)-1-methylethyl]benzene, and 1-bis[1-(4-aminophenyl)-1-methylethyl]benzene.

As examples of the nitrogen-containing compound (III), polyethyleneimine, polyallylamine, a polymer of dimethylaminoethylacrylamide, and the like can be given.

Examples of compounds containing an amide group include formamide, N-methylformamide, N,N-dimethylformamide, acetamide, N-methylacetamide, N,N-dimethylacetamide, propionamide, benzamide, pyrrolidone, and N-methylpyrrolidone. Examples of urea compounds include urea, methylurea, 1,1-dimethylurea, 1,3-dimethylurea, 1,1,3,3-tetramethylurea, 1,3-diphenylurea, and tributylthiourea.

Examples of the nitrogen-containing heterocyclic compounds include imidazoles such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine; pyrazine, pyrazole, pyridazine, quinoxaline, purine, pyrrolidine, piperidine, morpholine, 4-methylmorpholine, piperazine, 1,4-dimethylpiperazine, and 1,4-diazabicyclo[2.2.2]octane.

A base precursor having an acid-dissociable group can also be used as a nitrogen-containing organic compound. As examples of base precursors N-(t-butoxycarbonyl) piperidine, N-(t-butoxycarbonyl)imidazole, N-(t-butoxycarbonyl)benzimidazole, N-(t-butoxycarbonyl)-2-phenylbenzimidazole, N-(t-butoxycarbonyl)di-n-octylamine, N-(t-butoxy carbonyl)diethanolamine, N-(t-butoxycarbonyl)dicyclohexylamine, and N-(t-butoxycarbonyl)diphenylamine can be given.

Of these nitrogen-containing organic compounds, the nitrogen-containing compounds (I), nitrogen-containing compounds (II), and nitrogen-containing heterocyclic compounds are preferable.

The acid diffusion controller may be used either individually or in combination of two or more.

The amount of the acid diffusion controller to be added is preferably 15 parts by weight or less, more preferably 0.001–10 parts by weight, and particularly preferably 0.005–5 parts by weight for 100 parts by weight of the resin (B). If the proportion of the acid diffusion controller exceeds 15 parts by weight, sensitivity as a resist and developability of the exposed area tend to decrease. If the proportion is less than 0.001 part by weight, accuracy of pattern profiles and dimensions as a resist may decrease depending on processing conditions.

Alkali-soluble Resin

An alkali-soluble resin can be optionally added to the radiation-sensitive resin composition of the present invention.

As examples of alkali-soluble resins, poly(m-hydroxystyrene), poly(p-hydroxystyrene), partially hydrogenated poly(p-hydroxystyrene), p-hydroxystyrene/m-hydroxystyrene copolymer, p-hydroxystyrene/styrene copolymer, novolac resin, polyvinyl alcohol, and polyacrytic acid can be given.

Mw of the alkali-soluble resins is 1,000–1,000,000, and preferably 2,000–100,000.

These alkali-soluble resins may be used either individually or in combination of two or more.

The amount of alkali-soluble resins to be added is 30 parts by weight or less for 100 parts by weight of the resin (B).

Surfactant

Surfactants exhibiting an action of improving the applicability or striation of the composition and developability as a resist may be added to the radiation-sensitive resin composition of the present invention.

Examples of such surfactants include polyoxyethylene lauryl ether, polyoxyethylene stearyl ether, polyoxyethylene oleyl ether, polyoxyethylene n-octyl phenol ether, polyoxyethylene n-nonyl phenol ether, polyethylene glycol dilaurate, polyethylene glycol distearate; and commercially available products such as FTOP EF301, EF303, EF352 (manufactured by TOHKEM PRODUCTS CORPORATION), MEGAFAC F171, F173 (manufactured by Dainippon Ink and Chemicals, Inc.), Fluorad FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.), KP341 (manufactured by Shin-Etsu Chemical Co., Ltd.), and Polyflow No. 75, No. 95 (manufactured by Kyoeisha Chemical Co., Ltd.).

These surfactants may be used either individually or in combination of two or more.

The amount of surfactants to be added is preferably 2 parts by weight or less for 100 parts by weight of the resin (B).

Photosensitizer

A photosensitizer may be incorporated in the radiation curable resin composition of the present invention. As examples of photosensitizers, carbazoles, benzophenones, rose bengals, and anthracenes can be given. The amount of photosensitizers to be added is preferably 50 parts by weight or less for 100 parts by weight of the resin (B).

Other Additives

In addition, a dye and/or a pigment may be added to visualize latent images of exposed areas and to reduce the effect of halation during exposure. An adhesion adjuvant may be added to improve adhesion to the substrate.

As other additives, halation inhibitors such as 4-hydroxy-4'-methylchalcone, form improvers, preservation stabilizers, antifoaming agents, and the like can be added.

Solvent

The radiation-sensitive resin composition of the present invention is used as a composition solution. Such a composition solution is preparedby homogeneously dissolving the composition in a solvent so that the total solid concentration is 0.1–50 wt. %., and preferably 1–40 wt. %, and filtering the solution through a filter with a pore diameter of about 0.2 µm. Examples of solvents used for preparation of the composition solution include: ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, and i-propyl lactate; aliphatic carboxylic acid esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3-methoxypropionate, butyl 3-methyl-3-methoxybutyrate, methyl acetoacetate, ethyl acetoacetate, methyl pyruvate, and ethyl pyruvate; aromatic hydrocarbons such as toluene and xylene; ketones such as methyl ethyl ketone, methyl n-propyl ketone, methyl n-butyl ketone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; and lactones such as γ-butyrolactone can be given.

These solvents may be used either individually or in combinations of two or more.

Formation of Resist Pattern

A resist pattern is formed from the radiation-sensitive resin composition of the present invention by applying the composition solution prepared as mentioneed above to substrates such as a silicon wafer or a wafer covered with aluminum using an appropriate application method such as rotational coating, cast coating, and roll coating to forma resist film. The resist film is then optionally heated at a temperature of about 70–160° C. (hereinafter referred to as "PB") and exposed to light through a predetermined mask pattern. Radiation used here can be appropriately selected according to the types of acid generator (C) from among ultraviolet rays such as an $F_2$ excimer laser (wavelength: 157 nm), ArF excimer laser (wavelength: 193 nm), or a KrF excimer laser (wavelength: 248 nm), X-rays such as synchrotron radiation, and charged particle rays such as electron beams. The exposure conditions such as the amount of exposure are appropriately determined depending on the composition of the radiation-sensitive resin composition, types of additives, and the like.

In the present invention, it is preferable to perform post-exposure bake (hereinafter referred to as "PEB") at 70–160° C. for 30 seconds or more to consistently form minute resist patterns with high precision. If the heating temperature for PEB is less than 70° C., sensitivity may fluctuate according to the type of substrates.

A desired resist pattern is obtained by developing the resist using analkaline developer at 10–50° C. for 10–200 seconds, preferably at 15–30° C. for 15–100 seconds, and still more preferably at 20–25° C. for 15–90 seconds.

As the alkaline developer, an alkaline aqueous solution prepared by dissolving an alkali such as an a alkai metal hydroxide, aqueous ammonia, mono-, di-, or tri-alkylamine, mono-, di-, or tri-alkanolamine, heterocyclic amine, tetraalkylammonium hydroxide, choline, 1,8-diazabicyclo[5.4.0]-7-undecene, or 1,5-diazabicyclo[4.3.0]-5-nonene to a concentration of 1–10 wt. %, preferably 1–5 wt. %, and more preferably 1–3 wt. % can be used.

Moreover, an appropriate amount of a water-soluble organic solvent such as methanol and ethanol or a surfactant can be added to the developer comprising the above alkaline aqueous solution.

When forming a resist pattern, a protective film may be provided on the resist film in order to prevent an adverse effect of basic impurities and the like which are present in the environmental atmosphere.

EXAMPLES

The embodiments of the present invention are described in more detail by examples. However, these examples should not be construed as limiting the present invention.
<Synthesis of Compound (1)>

Synthesis Example 1

100 g of cholic acid was dissolved in 1,000 ml of dichloromethane in a reaction flask. 20 ml of methane sulfonic acid and 500 ml of isobutylene were added while controlling the temperature at −5° C. After tightly sealing the flask, the mixture was stirred for 30 hours at room temperature. After cooling the entire flask, the flask was carefully opened and the reaction solution was slowly added to 1,000 ml of a saturated aqueous solution of sodium hydrogen carbonate. The layer containing dichloromethane was separated and dried over anhydrous sodium sulfate, followed by evaporation of dichloromethane, thereby obtaining 50 g of a white solid of compound (1) of the following formula (14). The compound (1) is herein indicated as (A-1).

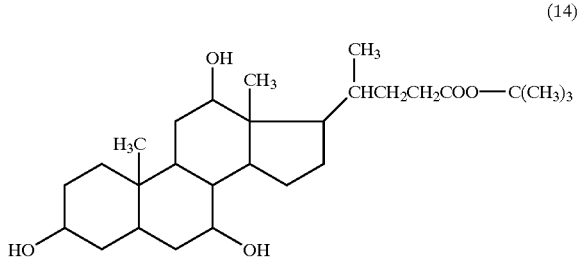

(14)

Synthesis Example 2

45 g of a white solid of compound (1) of the following formula (15) was obtained in the same manner as in Synthesis Example 1, except for using 100 g of lithocholic acid instead of 100 g of cholic acid. The compound (1) is herein indicated as (A-2)

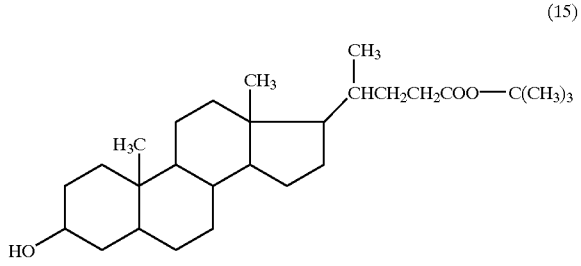

(15)

Synthesis Example 3

48 g of a white solid of compound (1) of the following formula (16) was obtained in the same manner as in Synthesis Example 1, except for using 100 g of deoxycholic acid instead of 100 g of cholic acid. The compound (1) is herein indicated as (A-3)

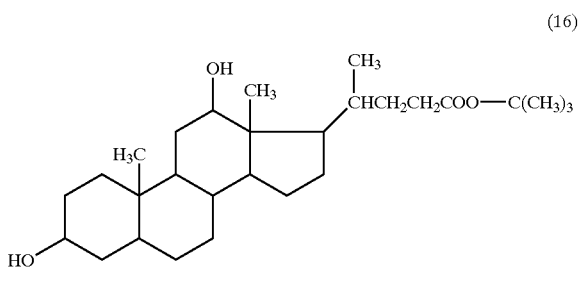

(16)

Synthesis Example 4

100 g of cholic acid was dissolved in 500 g of tetrahydrofuran. 30 g of triethylamine and 50 g of di-t-butyl dicarbonate was added to the solution to obtain a homogeneous solution and the mixture was reacted for 6 hours while controlling the temperature at 60° C. After the addition of 200 g of ethyl acetate, the water layer was removed. The organic layer was washed with water and n-hexane was added to crystallize the reaction product. The crystals were dried under vacuum to obtain 47 g of a white solid of compound (1) of the following formula (17). The compound (1) is herein indicated as (A-4).

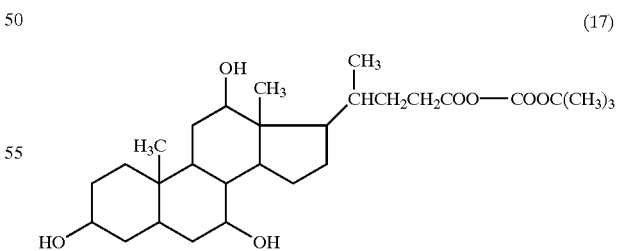

(17)

Synthesis Example 5

After dissolving 50 g of potassium carbonate in 500 g of water, 100 g of lithocholic acid was slowly added, followed by the addition of 500 g of tetrahydrofuran and 60 g of t-butyl bromoacetate. The mixture was then reacted for 7 hours at 60° C. After the addition of 200 g of ethyl acetate, the water layer was removed. The organic layer was washed with water and n-hexane was added to crystallize the reaction product. The crystals were dried under vacuum to obtain 56 g of a white solid of compound (1) of the following formula (18). The compound (1) is herein indicated as (A-5).

(18)

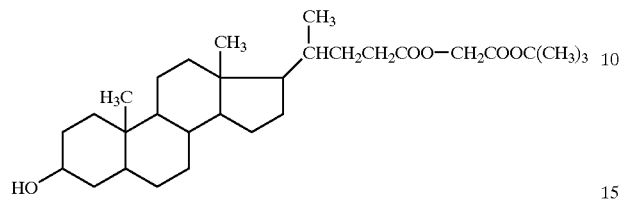

Synthesis Example 6

58 g of a white solid of compound (1) of the following formula (19) was obtained in the same manner as in Synthesis Example 5, except for using 100 g of cholic acid instead of 100 g of lithocholic acid. The compound (1) is herein indicated as (A-6).

(19)

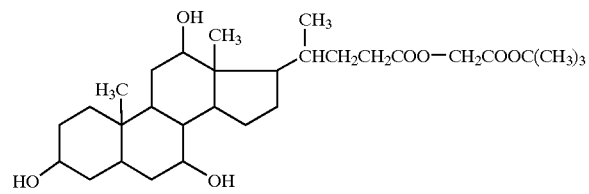

Synthesis Example 7

60 g of a white solid of compound (1) of the following formula (20) was obtained in the same manner as in Synthesis Example 5, except for using 100 g of deoxycholic acid instead of 100 g of lithocholic acid. The compound (1) is herein indicated as (A-7).

(20)

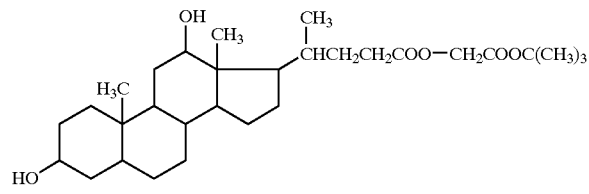

<Preparation of Resin (B)>

Synthesis Example 8

101 g of p-acetoxystyrene, 5 g of styrene, 42 g of p-t-butoxystyrene, 6 g of azobisisobutylonitrile, and 1 g of t-dodecylmercaptan were dissolved in 160 g of propylene glycol mondmethyl ether. The mixture was polymerized for 16 hours at 70° C. in a nitrogen atmosphere. After polymerization, the reaction solution was added dropwise to a large quantity of n-hexane to coagulate and purify the resulting resin.

After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 16,000 and 1.7 respectively. The result of $^{13}$C-NMR analysis confirmed that the copolymerization molar ratio of p-hydroxystyrene, styrene, and p-t-butoxystyrene of the copolymer was 72:5:23. This resin is referred to as a "resin (B-1)".

Mw and Mn of the resin (B-1) and the resins prepared in Synthesis Examples 9–12 were measured by gel permeation chromatography (GPC) using GPC columns (manufactured by Tosoh Corp., G2000H$_{XL}$×2, G3000H$_{XL}$×1, G4000H$_{XL}$×1) under the following conditions. Flow rate: 1.0 ml/minute, eluate: tetrahydrofuran, column temperature: 40° C., standard reference material: monodispersed polystyrene Synthesis Example 9

100 g of p-acetoxystyrene, 25 g of t-butyl acrylate, 18 g of styrene, 6 g of azobisisobutyronitrile, and 1 g of t-dodecylmercaptan were dissolved in 230 g of propylene glycol monomethyl ether. The mixture was polymerized for 16 hours while maintaining the reaction temperature at 70° C. in a nitrogen atmosphere. After polymerization, the reaction solution was added dropwise to a large quantity of n-hexane to coagulate and purify the resulting resin.

After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 11,500 and 1.6 respectively. The result of $^{13}$C-NMR analysis confirmed that the copolymerization molar ratio of p-hydroxystyrene, t-butyl acrylate, and styrene of the copolymer was 61:19:20. This resin is referred to as a "resin (B-2)".

Synthesis Example 10

176 g of p-t-butoxystyrene was anionically polymerized at −78° C. in 500 ml of tetrahydrofuran using n-butyllithium as a catalyst. After polymerization, the resulting resin solution was coagulated in methanol to obtain 150 g of white poly(p-t-butoxystyrene).

The poly(p-t-butoxystyrene) was dissolved in 600 g of dioxane. After the addition of diluted hydrochloric acid, the mixture was hydrolyzed at 70° C. for 2 hours. A white resin was obtained by adding the reaction product dropwise to a large quantity of water, thereby causing the resin to coagulate. A step of dissolving the resulting resin in acetone and coagulating the resin in a large quantity of water was repeated. The resulting white powder was filtered and dried overnight at 50° C. under reduced pressure.

The Mw and Mw/Mn of this resin were 10,400 and 1.10, respectively. $^{13}$C-NMR analysis confirmed that the resin is a copolymer of p-t-butoxystyrene and p-hydroxystyrene at a copolymerizationmolar ratio of thesemonomers of 32:68, in which only part of t-butyl group in the poly(p-t-butoxystyrene) had a hydrolyzed structure. This resin is referred to as a "resin (B-3)".

Synthesis Example 11

7 g of di-t-butyl carbonate was added to a solution in which 12 g of poly(p-hydroxystyrene) and 5 g of triethylamine were dissolved in 50 g of dioxane while stirring. The mixture was stirred for 6 hours at room temperature. Oxalic acid was then added to neutralize triethylamine. The reaction solution was dropped into a large quantity of water to coagulate the resin. The coagulated resin was washed with water several times. The resin was then filtered and dried at 50° C. overnight under reduced pressure.

Mw and Mw/Mn of this resin were respectively 9,200 and 1.8. As a result of $^{13}$C-NMR analysis, the resin was found to have a structure in which 30 mol % of hydrogen atoms of a phenolic hydroxyl group in poly(p-hydroxystyrene) was replaced by t-butoxycarbonyl groups. This resin is referred to as a "resin (B-4)".

Synthesis Example 12

25 g of a copolymer of p-hydroxystyrene and p-t-butoxystyrene (copolymerization molar ratio, 90:10) was dissolved in 100 g of n-butyl acetate. Nitrogen gas was bubbled through the solution for 30 minutes. After the addition of 3.3 g of ethyl vinyl ether and 1 g of pyridinium p-toluenesulfonate as a catalyst, the mixture was reacted at room temperature for 12 hours. The reaction solution was dropped into a 1 wt. % ammonium aqueous solution to coagulate the resin. The resin was filtered and dried overnight in a drier at 50° C. under reduced pressure.

Mw and Mw/Mn of this resin were respectively 13,000 and 1.01. As a result of $^{13}$C-NMR analysis, the resin was found to have a structure in which 23 mol % of hydrogen atoms of the phenolic hydroxyl group in poly(p-hydroxystyrene) was replaced by ethoxyethyl groups, and 10 mol % by t-butyl groups. This resin is referred to as a "resin (B-5)".

Examples 1–17 and Comparative Examples 1–2

Components shown in Table 1 (part(s) indicates part(s) by weight) were mixed to prepare homogeneous solutions. The solutions were filtered through a membrane filter with a pore diameter of 0.2 μm to prepare solution compositions. The solution composition was spin-coated on a silicon wafer. PB was then performed under the conditions shown in Table 2 to form resist coatings with a thickness of 0.5 μm from the compositions of Examples 1–13, Examples 15–17, and Comparative Examples 1–2, and a resist coating with a thickness of 0.1 μm from the composition of Example 14.

The resist coatings were exposed to radiations using a stepper "NSR2205 EX12B" (manufactured by Nikon Corp., numerical aperture: 0.55) in Examples 1–13 and Comparative Examples 1–2, an F2 excimer laser exposure apparatus "XLS" (manufactured by Ultratech Corp., numerical aperture: 0.60) in Examples 14, and an electron beam lithography system "HL700" (manufactured by Hitachi, Ltd., acceleration voltage: 30 KeV) in which the acceleration voltage was remodeled to 50 KeV in Examples 15–17. PEB was performed under the conditions shown in Table 2. The resist patterns were developed at 23° C. for 1 minute by a paddle method using a 2.38 wt. % tetramethylammonium hydroxide aqueous solution. The resist coatings were then washed with purified water and dried to form a resist pattern. The results of the evaluation of each resist are shown in Table 3.

Evaluation of resists was carried out as follows.

Sensitivity

A resist coating was formed on a silicon wafer, exposed to light, and immediately baked (PEB), followed by alkali development, washing with water, and drying. Sensitivity was evaluated based on an optimum exposure dose capable of forming a 1:1 line and space pattern (1L1S) with a line width of 0.22 μm.

Resolution

The minimum line and space (1L1S) dimension (μm) resolved by an optimum dose of irradiation was taken as the resolution.

Radiation Transmittance

A resist coating with a thickness of 0.5 μm was formed on a quartz plate by spin coating. Then, transmittance at a wavelength of the light source used for exposure was measured. A resist coating was evaluated as "Good" if the transmittance was 60% or more, and as "Bad" if the transmittance was less than 60%.

Partial Insolublization

A 5 mm$^2$ pattern was exposed to radiation at a dose two times the optimumdose for forming a line and space pattern (1L1S) with a line width of 0.22 μm. Resist coatings producing no insoluble matters were evaluated as "Good", and those producing insoluble matters were evaluated as "Bad".

Pattern Smoothness

A line-and-space pattern (1L1S) with a line width of 0.25 μm was formed. The average of line width in a 0.01 μm range in the longitudinal direction was determined at 50 positions along the length of the pattern. Resist coatings in which the difference of the maximum and minimum values of the 50 position average of less than 0.01 μm was judged as having "Good" pattern smoothness, and those 0.01 μm or more was judged as having "Bad" pattern smoothness.

The acid generators (C), acid diffusion controllers, other additives, and solvents in Table 1 are as follows.

Acid generator (C)

C-1: bis(4-t-butylphenyl)iodonium nonafluoro-n-butanesulfonate

C-2: bis(4-t-butylphenyl)iodonium 10-camphorsulfonate

C-3: bis(4-t-butylphenyl)iodoniumtrifluoromethane sulfonate

C-4: N-(trifluoromethanesulfonyloxy)bicyclo[2.2.1]-hept-5-ene-2,3-dicarboxyimide C-5: bis(cyclohexylsulfonyl)diazomethane C-6: triphenylsulfonium trifluoromethanesulfonate C-7: N-(10-camphorsulfonyloxy)succinimide Acid Diffusion Controller D-1: tri-n-octylamine D-2: triethanolamine D-3: 2-phenylpyridine D-4: N,N,N',N'-tetrakis(2-hydroxypropyl) ethylenediamine D-5: 2-phenylbenzimidazole Solvent E-1: Ethyl lactate E-2: Ethyl 3-ethoxypropionate E-3: Propylene glycol monomethyl ether acetate E-4: 2-Heptanone

TABLE 1

Unit in parenthesis: part by weight

|  | Compound (1) | Resin (B) | Acid Generator | Acid diffusion controller | Solvent |
|---|---|---|---|---|---|
| Example 1 | A-1 (5) | B-1 (100) | C-4 (4) | D-3 (0.2) | E-4 (500) |
| Example 2 | A-2 (5) | B-2 (100) | C-4 (5) | D-3 (0.2) | E-1 (500) |
| Example 3 | A-3 (5) | B-3 (100) | C-2 (2) C-4 (2) | D-3 (0.2) | E-1 (500) |
| Example 4 | A-4 (5) | B-4 (100) | C-4 (5) | D-3 (0.2) | E-1 (500) |
| Example 5 | A-5 (5) | B-5 (100) | C-5 (4) | D-3 (0.2) | E-1 (500) |
| Example 6 | A-6 (5) | B-2 (100) | C-4 (5) C-7 (1) | D-3 (0.2) | E-1 (500) E-3 (150) |
| Example 7 | A-7 (5) | B-1 (100) | C-4 (5) | D-3 (0.2) | E-1 (500) E-3 (150) |
| Example 8 | A-5 (5) | B-1 (100) | C-4 (4) | D-5 (0.2) | E-1 (500) E-3 (150) |
| Example 9 | A-6 (5) | B-1 (100) | C-4 (4) | D-5 (0.2) | E-1 (500) |
| Example 10 | A-7 (5) | B-1 (100) | C-4 (5) | D-5 (0.2) | E-1 (500) |
| Example 11 | A-5 (5) | B-1 (100) | C-6 (3) | D-4 (0.2) | E-1 (350) E-2 (150) |
| Example 12 | A-6 (5) | B-2 (100) | C-3 (3) | D-2 (0.2) | E-1 (350) E-2 (150) |
| Example 13 | A-7 (5) | B-1 (100) | C-1 (2) C-3 (1) | D-5 (0.1) | E-1 (350) E-2 (150) |
| Example 14 | A-5 (5) | B-1 (100) | C-3 (4) | D-5 (0.1) | E-1 (500) |
| Example 15 | A-6 (5) | B-1 (100) | C-1 (5) | D-5 (0.1) | E-1 (500) |
| Example 16 | A-7 (5) | B-1 (100) | C-1 (3) | D-5 (0.1) | E-1 (500) |
| Example 17 | A-5 (5) | B-1 (100) | C-1 (5) | D-1 (0.1) | E-1 (500) |
| Comparative Example 1 | — | B-1 (100) | C-4 (3) | D-3 (0.2) | E-1 (500) |
| Comparative Example 2 | — | B-1 (100) | C-6 (8) | D-3 (0.2) | E-1 (500) |

TABLE 2

| | PB | | | PEB | |
|---|---|---|---|---|---|
| | Temp (° C.) | Time (sec) | Radiation | Temp (° C.) | Time (sec) |
| Example 1 | 130 | 60 | KrF excimer laser | 130 | 60 |
| Example 2 | 130 | 60 | KrF excimer laser | 130 | 60 |
| Example 3 | 130 | 60 | KrF excimer laser | 130 | 60 |
| Example 4 | 100 | 60 | KrF excimer laser | 100 | 60 |
| Example 5 | 90 | 60 | KrF excimer laser | 100 | 60 |
| Example 6 | 120 | 60 | KrF excimer laser | 130 | 60 |
| Example 7 | 130 | 60 | KrF excimer laser | 130 | 60 |
| Example 8 | 100 | 60 | KrF excimer laser | 120 | 60 |
| Example 9 | 110 | 60 | KrF excimer laser | 130 | 60 |
| Example 10 | 120 | 60 | KrF excimer laser | 130 | 60 |
| Example 11 | 130 | 60 | KrF excimer laser | 120 | 60 |
| Example 12 | 120 | 60 | KrF excimer laser | 120 | 60 |
| Example 13 | 110 | 60 | KrF excimer laser | 130 | 60 |
| Example 14 | 130 | 60 | $F_2$ excimer laser | 130 | 60 |
| Example 15 | 110 | 60 | Electron beam | 130 | 60 |
| Example 16 | 110 | 60 | Electron beam | 130 | 60 |
| Example 17 | 110 | 60 | Electron beam | 130 | 60 |
| Comparative Example 1 | 130 | 60 | KrF excimer laser | 130 | 60 |
| Comparative Example 2 | 130 | 60 | KrF excimer laser | 130 | 60 |

TABLE 3

| | Sensitivity | Resolution | Partial insolublization | Pattern Smoothness | Radiation Transmittance |
|---|---|---|---|---|---|
| Example 1 | 300 J/m$^2$ | 0.20 μm | Good | Good | Good |
| Example 2 | 280 J/m$^2$ | 0.19 μm | Good | Good | Good |
| Example 3 | 310 J/m$^2$ | 0.19 μm | Good | Good | Good |
| Example 4 | 280 J/m$^2$ | 0.18 μm | Good | Good | Good |
| Example 5 | 340 J/m$^2$ | 0.17 μm | Good | Good | Good |
| Example 6 | 280 J/m$^2$ | 0.19 μm | Good | Good | Good |

TABLE 3-continued

| | Sensitivity | Resolution | Partial insolublization | Pattern Smoothness | Radiation Transmittance |
|---|---|---|---|---|---|
| Example 7 | 380 J/m$^2$ | 0.20 μm | Good | Good | Good |
| Example 8 | 280 J/m$^2$ | 0.20 μm | Good | Good | Good |
| Example 9 | 320 J/m$^2$ | 0.19 μm | Good | Good | Good |
| Example 10 | 350 J/m$^2$ | 0.20 μm | Good | Good | Good |
| Example 11 | 320 J/m$^2$ | 0.20 μm | Good | Good | Good |
| Example 12 | 280 J/m$^2$ | 0.20 μm | Good | Good | Good |
| Example 13 | 260 J/m$^2$ | 0.18 μm | Good | Good | Good |
| Example 14 | 150 J/m$^2$ | 0.17 μm | Good | Good | — |
| Example 15 | 0.1 C/m$^2$ | 0.17 μm | Good | Good | — |
| Example 16 | 0.1 C/m$^2$ | 0.17 μm | Good | Good | — |
| Example 17 | 0.1 C/m$^2$ | 0.18 μm | Good | Good | — |
| Comparative Example 1 | 400 J/m$^2$ | 0.22 μm | Good | Bad | Good |
| Comparative Example 2 | 380 J/m$^2$ | 0.20 μm | Bad | Good | Bad |

The radiation-sensitive resin composition of the present invention is useful as a chemically amplified resist that responds to deep ultraviolet rays such as a KrF excimer laser, ArF excimer laser, or an F2 excimer laser. The resist exhibits high sensitivity, resolution, radiation transmittance, and surface smoothness of minute patterns, and overcomes the problem of partial insolublization during over exposure without adversely affecting the basic characteristics of a resist such as pattern form, dry etching resistance, heat resistance, and the like.

The composition is extremely suitable in the field of microfabrication represented by manufacturing of semiconductor devices, which will become more and more minute.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:

(A) a compound of the following formula (1).

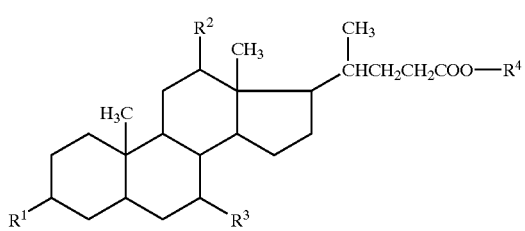

wherein R$^1$, R$^2$, and R$^3$ individually represent a hydrogen atom, a hydroxyl group, or a monovalent organic group, provided that at least one of the groups R$^1$, R$^2$, and R$^3$ is a hydroxyl group, and R$^4$ represents a group of the following formula (3),

wherein R$^6$ represents a monovalent acid-dissociable group;

(B) a resin cornprising a recurring unit of the following formula (2),

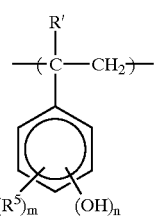

wherein R$^5$ represents a hydrogen atom or a monovalent organic group R' represent a hydrogen atom or methyl group, n is an inteaer of 1–3, and m is an integer of 0–3, and a recurring unit containing an acid-dissociable group, the resin being insoluble or scarcely soluble in alkali solution, and (C) a photoacid generator.

2. The radiation-sensitive resin composition according to claim 1, wherein R$^1$, R$^2$, and R$^3$ in the formula (1) are individually a hydrogen atom, hydroxyl group, methyl group, ethyl group, methoxy group, or t-butoxy group.

3. The radiation-sensitive resin composition according to claim 1, wherein R$^1$, R$^2$, and R$^3$ in the formula (1) are individually a hydrogen atom or hydroxyl group.

4. The radiation-sensitive resin composition according to claim 1, wherein R$^6$ in the formula (3) is a substituted methyl group, 1-substituted ethyl group, 1-branched alkyl group, tricarbilsilyl group, tricarbilgermyl group, alkoxycarbonyl group, acyl group, or cyclic acid-dissociable group.

5. The radiation-sensitive resin composition according to claim 1, wherein R$^6$ in the formula (3) is a t-butyl group, benzyl group, 1-methoxyethyl group, 1-ethoxyethyl group, trimethylsilyl group, t-butoxycarbonyl group, t-butoxycarbonylmethyl group, 1-methylcyclopentyl group, 1-ethylcyclopentyl group, 1-methylcyclohexyl group, 1-ethycyclohexyl group, tetrahydropyranyl group, tetrahydrofuranyl group, tetrahydrothiopyranyl group, tetrahydrothiofuranyl group, or 2-methyl-2-adamantyl group.

6. The radiation-sensitive resin composition according to claim 1, wherein the recurring unit containing an acid-dissociable group in the resin (B) is a unit obtainable by cleavage of a polymerizable unsaturated bond in a compound, which is obtainable by replacing the hydrogen atom in the phenolic hydroxyl group or carboxyl group in a compound selected from the group consisting of o-hydroxystyrene, m-hydroxystyrene, p-hydroxystyrene, p-hydroxy-α-methylstyrene, and (meth)acrylic acid, with a monovalent acid-dissociable group.

7. The radiation-sensitive resin composition according to claim 1, wherein the acid-dissociable group in the resin (B) is a substituted methyl group, 1-substituted ethyl group, 1-branched alkyl group, tricarbilsilyl group, tricarbilgermyl group, alkoxycarbonyl group, acyl group, or cyclic acid-dissociable group.

8. The radiation-sensitive resin composition according to claim 1, wherein the acid-dissociable group in the resin (B) is a t-butyl group, benzyl group, 1-methoxyethyl group, 1-ethoxyethyl group, trimethylsilyl group, t-butoxycarbonyl group, t-butoxycarbonylmethyl group, tetrahydropyranyl group, tetrahydrofuranyl group, tetrahydrothiopyranyl group, tetrahydrothiofuranyl group, or 2-methyl-2-adamantyl group.

9. The radiation-sensitive resin composition according to claim 1, wherein the introduction ratio of the acid-dissociable groups to the resin (B), which is the ratio of the number of the acid-dissociable groups to the total number of the unprotected acidic functional groups and the acid-dissociable groups in the resin is 10–60%.

10. The radiation-sensitive resin composition according to claim 1, wherein the photoacid generator (C) comprises a compound of the following formula (4),

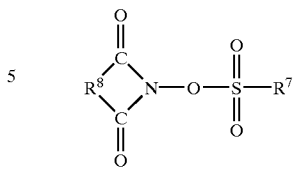

(4)

wherein $R^7$ is a monovalent organic group and $R^8$ is a divalent organic group.

11. The radiation-sensitive resin composition according to claim 1, wherein the photoacid generator (C) is at least one compound selected from the group consisting of N-(trifluromethysulfonyloxy)bicyclo[2.2.1]hept-5-ene-2,3-dicarboxyimide, N-(10-camphorsulfonyloxy)succimmide, N-(10-camphorsulfonyloxy)bicyclo[2.2.1 ]hept-5-ene-2,3-dicarboxyimide, N-{(5-methyl-5-methoxycarbonylbicyclo[2,2,1]heptan-2-yl)-sulfonyloxy}succinimide, N-{(5-methyl-5-methoxycarbonylbicyclo[2,2,1]heptan-2-yl)-sulfonyloxy}bicyclo[2.2.1]hept-5-ene-2,3-dicarboxyimide, and N-(nonafluoro-n-butanesulfonyloxy)bicyclo[2.2.1]hept-5-ene-2,3-dicarboxyimide.

12. The radiation-sensitive resin composition according to claim 1, further comprising an acid diffusion controller.

13. The radiation-sensitive resin composition according to claim 12, wherein the acid diffusion controller is a nitrogen-containing organic compound.

* * * * *